United States Patent
McClure

(10) Patent No.: US 7,224,600 B2
(45) Date of Patent: May 29, 2007

(54) TAMPER MEMORY CELL

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 269 days.

(21) Appl. No.: 10/783,935

(22) Filed: Feb. 20, 2004

(65) Prior Publication Data

US 2005/0152177 A1 Jul. 14, 2005

Related U.S. Application Data

(60) Provisional application No. 60/535,064, filed on Jan. 8, 2004.

(51) Int. Cl.
*G11C 11/00* (2006.01)

(52) U.S. Cl. .............. 365/154; 365/210; 365/189.05; 307/100

(58) Field of Classification Search ......... 365/154, 365/210, 189.05; 307/100; 323/220
See application file for complete search history.

(56) References Cited

U.S. PATENT DOCUMENTS

| | | | | |
|---|---|---|---|---|
| 5,047,985 A * | 9/1991 | Miyaji | ......... | 365/203 |
| 5,159,571 A | 10/1992 | Ito et al. | | |
| 5,226,011 A * | 7/1993 | Yanagisawa | ......... | 365/189.05 |
| 5,276,647 A * | 1/1994 | Matsui et al. | ......... | 365/201 |
| 5,297,094 A | 3/1994 | Rastegar | | |
| 5,311,477 A | 5/1994 | Rastegar | | |
| 5,373,466 A | 12/1994 | Landeta et al. | | |
| 5,668,770 A * | 9/1997 | Itoh et al. | ......... | 365/227 |
| 5,774,411 A | 6/1998 | Hsieh et al. | | |
| 5,781,482 A * | 7/1998 | Sakata | ......... | 365/189.11 |
| 5,991,207 A * | 11/1999 | Sedlak et al. | ......... | 365/189.01 |
| 6,041,003 A * | 3/2000 | Casper et al. | ......... | 365/202 |
| 6,157,578 A * | 12/2000 | Brady | ......... | 365/189.05 |
| 6,469,930 B1 * | 10/2002 | Murray | ......... | 365/154 |
| 6,724,648 B2 | 4/2004 | Khellah et al. | | |
| 6,963,499 B2 | 11/2005 | Rimondi et al. | | |
| 2002/0016914 A1 * | 2/2002 | Seki et al. | ......... | 713/172 |
| 2004/0223362 A1 * | 11/2004 | Coker | ......... | 365/154 |

* cited by examiner

*Primary Examiner*—Richard Elms
*Assistant Examiner*—Eric J. Wendler
(74) *Attorney, Agent, or Firm*—Lisa K. Jorgenson; Andre M. Szuwalski

(57) ABSTRACT

A circuit includes a volatile memory array and a logic circuit operable to detect a memory array tamper situation and generate at least one control signal responsive thereto. Circuitry associated with each of the individual cells within the volatile memory array responds to the at least one control signal by destroying any data stored by the associated memory cell. Data is destroyed using one of several options including: shorting a true node of the latch to a complement node of the latch, shorting the true and complement nodes of the latch to a bit line and a complement bit line, shorting one of the true/complement nodes of the latch to a reference voltage, shorting both the true and complement nodes of the latch to at least one reference voltage, coupling a first and second positive reference voltage inputs to a positive/ground voltage supply, or shorting the bit line to a reference voltage while the pass gate is activated.

27 Claims, 8 Drawing Sheets

TAMPER MEMORY CELL

PRIORITY CLAIM

The present application claims priority from United States Provisional Application for Patent No. 60/535,064 filed Jan. 8, 2004, the disclosure of which is hereby incorporated by reference.

BACKGROUND OF THE INVENTION

1. Technical Field of the Invention

The present invention relates to devices which include volatile memory cells and, more particularly, to circuitry for responding to a tamper detection situation by clearing stored data within those volatile memory cells.

2. Description of Related Art

A commonly used structure for a volatile memory cell comprises the well known 6T memory cell. A conventional 6T memory cell structure is shown in FIG. 1. The 6T cell comprises a four transistors 10, 12, 14 and 16 arranged in a cross-coupled latch 18 configuration with two access transistors (pass gates) 20 and 22 connected thereto for allowing bit line (BL and BLC) access to the latched complementary logic values (at nodes T and C) stored by the latch.

Volatile memory cells are utilized in a number of different applications to store data. It is not uncommon for such memory cells to be used in secure applications such as in a smart card (see, FIG. 2) in order to store user and account related data. It is critically important to protect the security of that stored data. To that end, a need exists in the art to destroy the stored data in response to detection of a tamper situation (such as, for example, when an unauthorized individual attempts to access the memory cells).

SUMMARY OF THE INVENTION

In accordance with one embodiment of the invention, a circuit includes a volatile memory array and a logic circuit operable to detect a memory array tamper situation and generate at least one control signal responsive thereto. Circuitry associated with each of a plurality of individual cells within the volatile memory array responds to the at least one control signal and by destroying any data stored by the associated memory cell.

In accordance with another embodiment of the invention, a memory circuit includes a data latch and circuitry which is responsive to a control signal to cause data stored by the latch to be destroyed.

One implementation of the circuitry shorts a true node of the latch to a complement node of the latch.

Another implementation of the circuitry simultaneously activates first and second pass gates for the latch to short the true and complement nodes of the latch to a bit line and a complement bit line, respectively.

Yet another implementation of the circuitry shorts one of the true/complement nodes of the latch to a reference voltage.

Still another implementation of the circuitry shorts both the true and complement nodes of the latch to at least one reference voltage.

Another implementation of the circuitry couples a first and second positive reference voltage inputs (for a first and second sides, respectively, of the latch) to a positive/ground voltage supply.

In another embodiment of the invention, a memory circuit comprises a memory cell including a data node and a pass gate coupling the data node of the memory cell to a bit line. Circuitry responsive to at least one control signal shorts the bit line to a reference voltage while the pass gate is activated to cause data stored by the memory cell to be destroyed.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Although embodiments of the present invention are illustrated in the context of an exemplary 6T cell, it will be recognized by those skilled in the art that these embodiments may be used with other types of memory cells.

Destroying the stored data in response to a detected tamper situation may comprise clearing the memory cells so that they enter unknown logical states. Even more preferred is a clearing operation which forces each of the memory cells to enter a certain known or fixed state. For example, all "1" or all "0" or a certain pattern.

Figure 1:
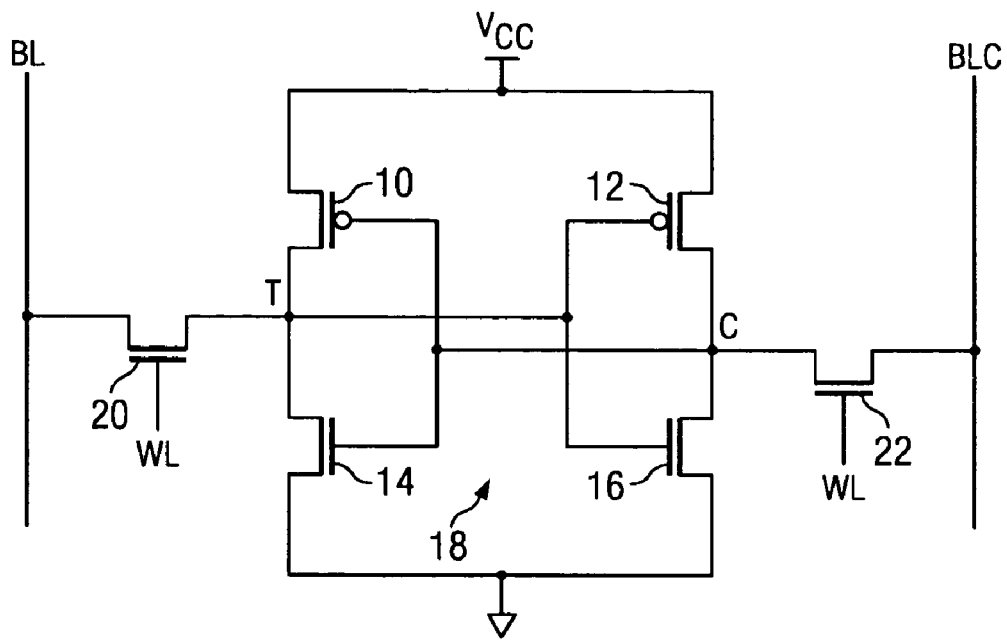
FIG. 1 is a schematic diagram of a prior art 6T memory cell.
Figure 2:
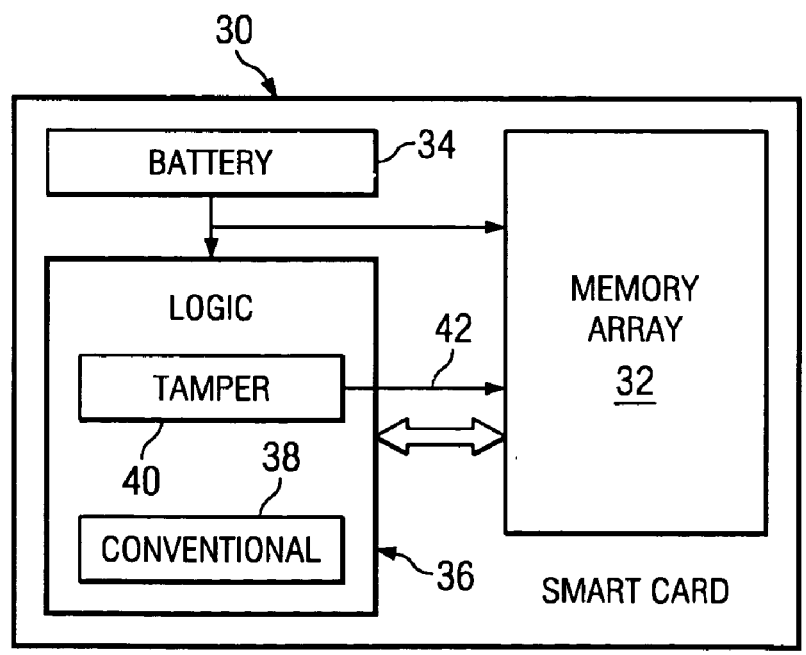
FIG. 2 is a block diagram of a smart card.

Reference is now made to FIG. 2 which illustrates a block diagram of a smart card 30 which includes a memory array 32 comprised of a plurality of volatile memory cells (for example, cells of the 6T type shown in FIG. 1), an internal battery/voltage supply 34 (Vcc); and logic circuitry 36 (perhaps including a microprocessor) comprising circuitry 38 related to performing conventional smart card operations as well as circuitry 40 to detect the existence of a tamper situation. It will be recognized that the tamper detection circuitry/logic 40 could instead be implemented separately from the conventional smart card operation logic circuitry 38. As a result of a detected tamper situation, tamper detect control signal(s) 42 are generated and applied to the array in order to cause the data stored therein to be destroyed.

Figure 3:
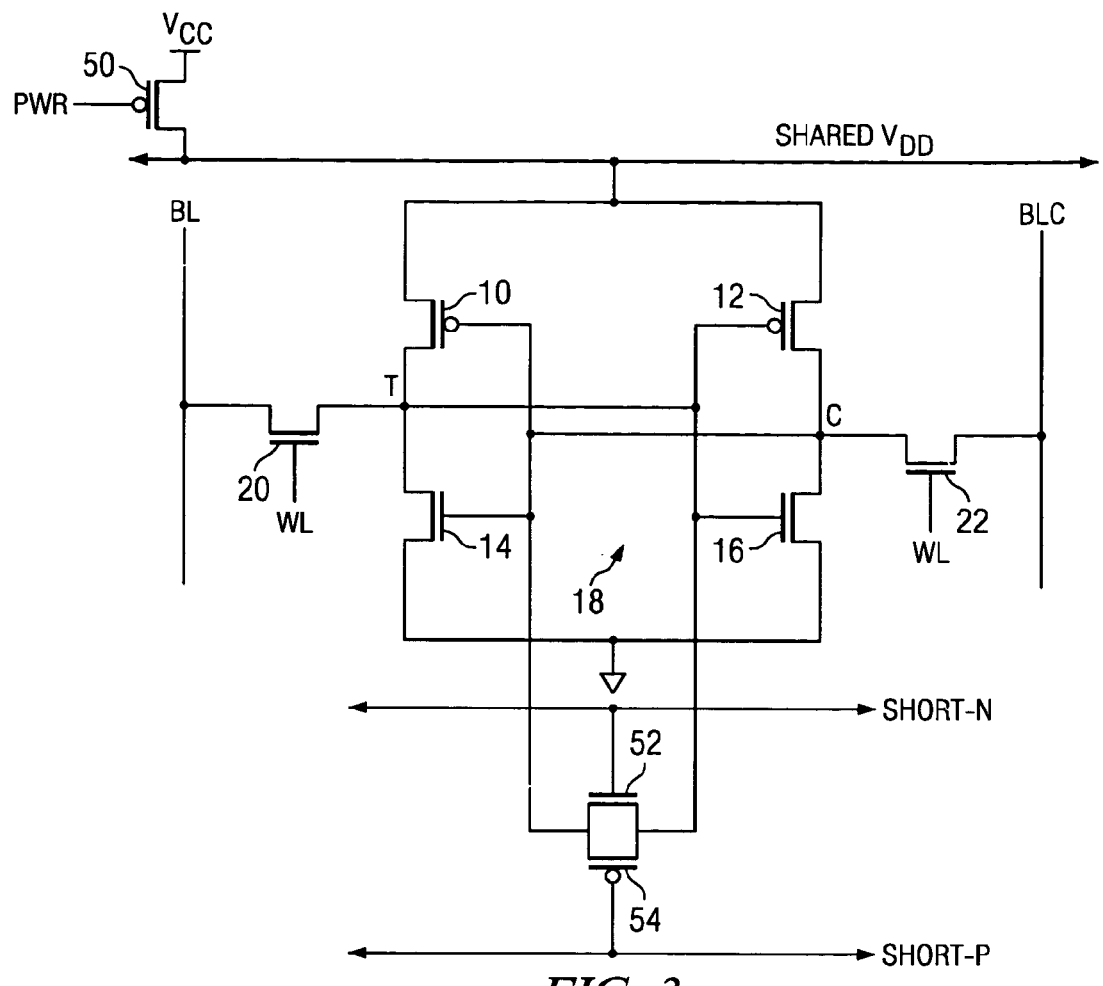
FIG. 3 is a schematic diagram of a first embodiment for a volatile memory cell with a tamper detection data destroy response.

Reference is now made to FIG. 3 which illustrates a schematic diagram of a first embodiment for a volatile memory cell with a tamper detection data destroy response. A p-channel transistor 50 is connected between Vcc and a shared Vdd bus. The gate of the p-channel transistor 50 receives the signal PWR. An additional n-channel 52 or p-channel 54 (or perhaps both) transistor is added to the conventional 6T memory cell for performing the data clearing operation.

For the n-channel embodiment, the n-channel transistor 52 has its conduction terminals (drain/source) connected between the true (T) and complement (C) nodes of the 6T memory cell. The gate of the n-channel transistor 52 is connected to receive a signal SHORT-N which is an active high control signal generated by logic 40 in response to a detected tamper situation. When Power (PWR) goes high (thus isolating the shared Vdd bus for the memory cells from Vcc) and SHORT-N goes high, the n-channel transistor 52 turns on and shorts together the true (T) and complement (C) nodes of the 6T memory cell. This will effectively destroy the data state being held by the latch 18, but will not drive the latch to a known fixed data state. The destruction of the stored data is accomplished through dynamic gate charging.

In the p-channel embodiment, the p-channel transistor 54 has its conduction terminals (drain/source) connected between the true (T) and complement (C) nodes of the 6T memory cell. The gate of the p-channel transistor 54 is connected to receive a signal SHORT-P which is an active low control signal generated by the logic 40 in response to a detected tamper situation. When PWR goes high (thus isolating the shared Vdd bus for the memory cells from Vcc) and SHORT-P goes low, the p-channel transistor 54 turns on and shorts together the true (T) and complement (C) nodes of the 6T memory cell. As with the n-channel implementation, this will effectively destroy the data state being held by the latch, but will not drive the latch to a known fixed data state.

It will be recognized that a combined n-channel and p-channel implementation could also be provided (i.e., both transistors 52 and 54 are included in this embodiment) in which case the SHORT-N and SHORT-P signals would both be appropriately generated by the logic 40 in response to a detected tamper situation.

Figure 4:
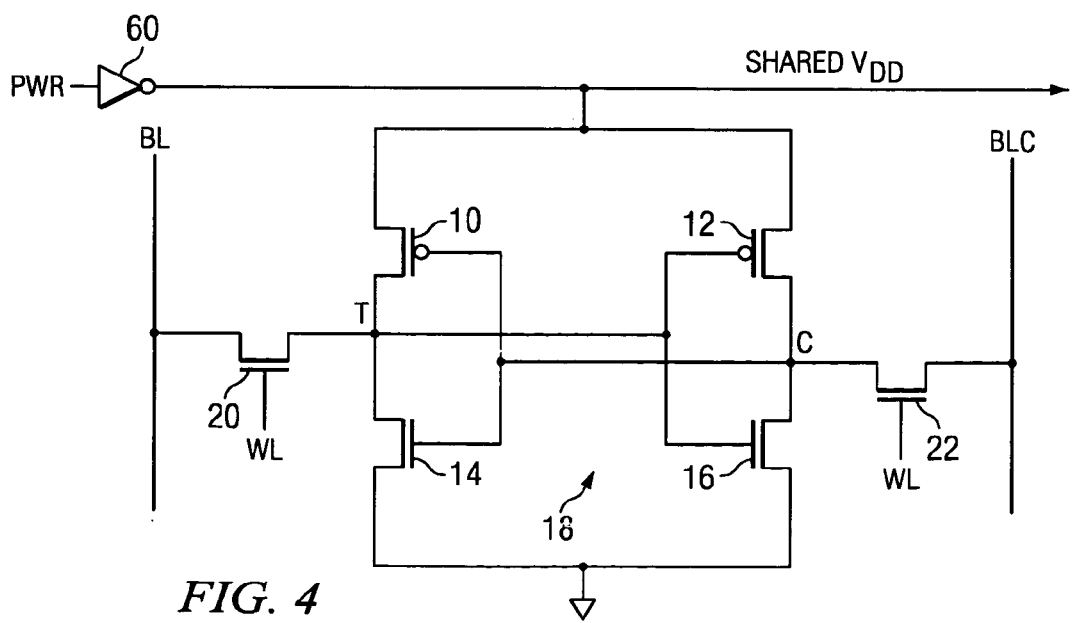
FIG. 4 is a schematic diagram of a second embodiment for a volatile memory cell with a tamper detection data destroy response.

Reference is now made to FIG. 4 which illustrates a second embodiment for a volatile memory cell with a tamper detection data destroy response. In this embodiment, a NOT logic gate 60 is substituted for the transistor 50 to selectively drive the shared Vdd reference of the memory cells to ground (for example, in response to a PWR high signal controlled by the tamper detection circuitry). This differs from the p-channel transistor 50 control implementation shown in FIG. 3 which causes the shared Vdd bus to float in response to PWR high. At the same time as PWR goes high, the tamper detect control circuitry drives the word lines (WL) high (to couple the T and C nodes to BL and BLC, respectively through the pass gates 20 and 22) and pulls the bit lines (BL and BLC) low. This effectively destroys the logic data state being held by the latch, but will not drive the latch to a known fixed data state. The destruction of the stored data is accomplished through word line dynamic gate charging.

In an alternative embodiment, the NOT gate 60 could instead comprise a p-channel device 52 (like that shown in FIG. 3).

Figure 5A:
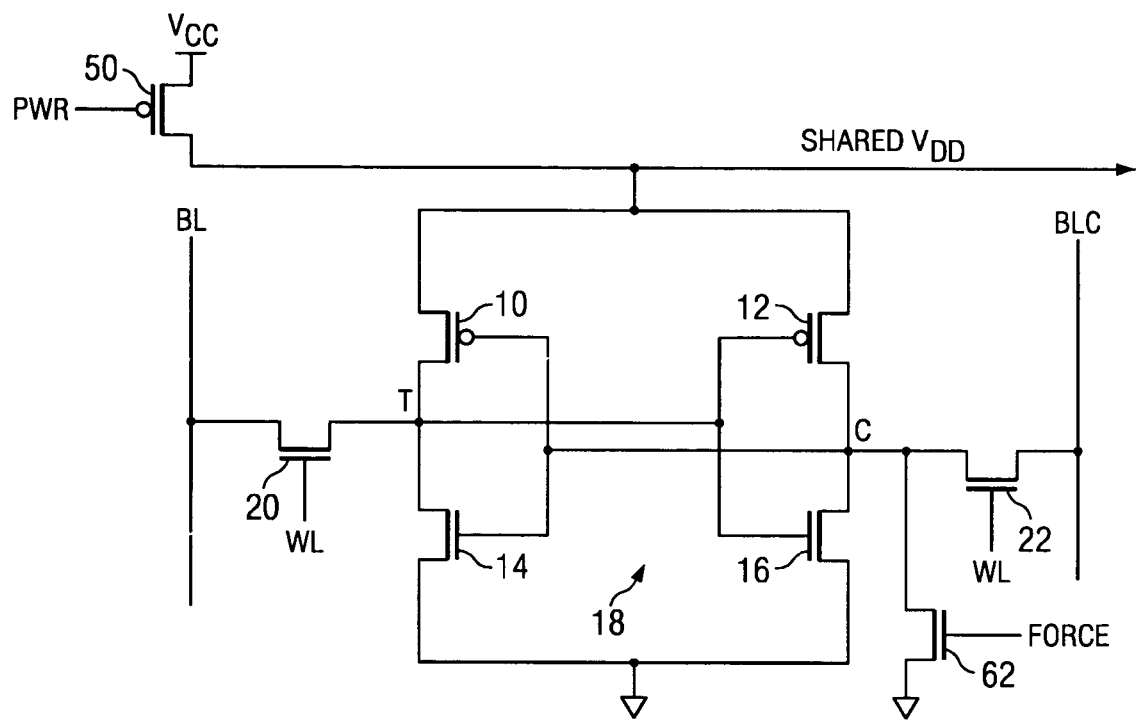
FIGS. 5a–5d are schematic diagrams of a third embodiment for a volatile memory cell with a tamper detection data destroy response.

Reference is now made to FIGS. 5a–5d which illustrate a third embodiment for a volatile memory cell with a tamper detection data destroy response. In FIG. 5a, an additional n-channel transistor 62 is added to the conventional 6T memory cell. The n-channel transistor 62 has its conduction terminals (drain/source) connected between the complement (C) node of the 6T memory cell and ground. The gate of the n-channel transistor 62 is connected to receive a signal FORCE which is an active high control signal generated by the logic 40 in response to a detected tamper situation. When Power (PWR) goes high (thus isolating the shared Vdd bus of the memory cells from Vcc) and FORCE goes high, the n-channel transistor 62 turns on and forces the C node of the latch low. FORCE can return low after PWR goes low. It will be recognized that this destroys the logic state being held by the latch, and also advantageously drives the latch to a known fixed state. The destruction of the stored data is accomplished through dynamic gate charging.

Figure 5B:
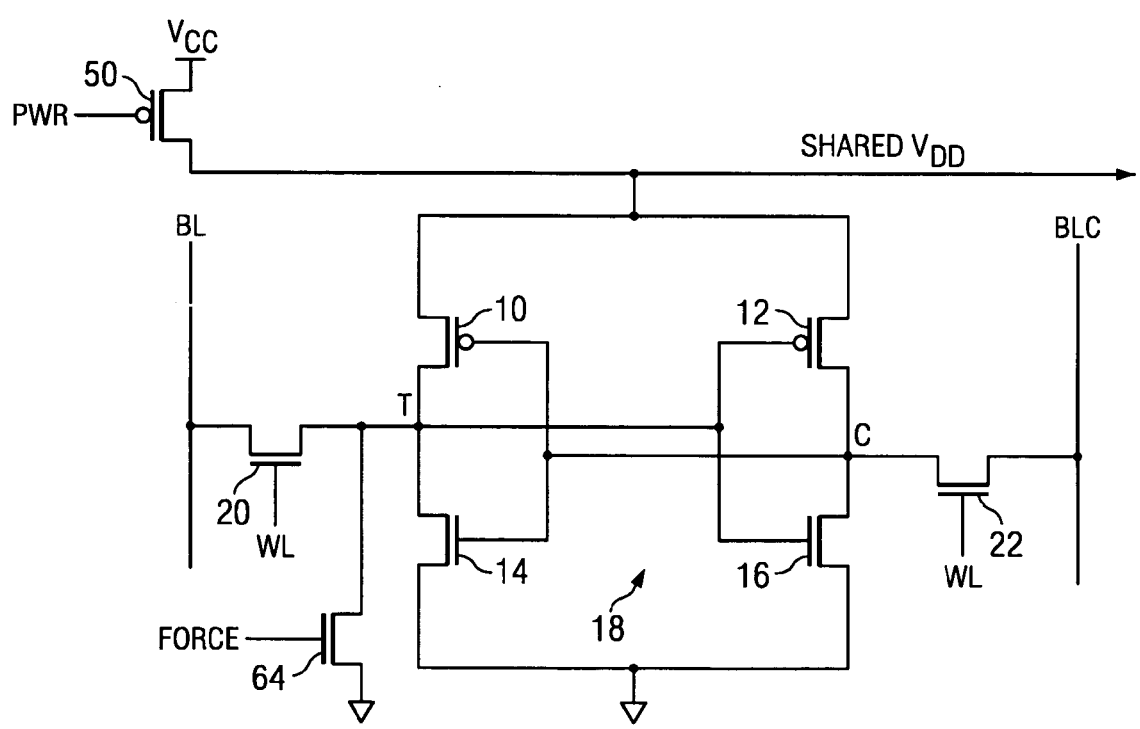
Figure 5C:
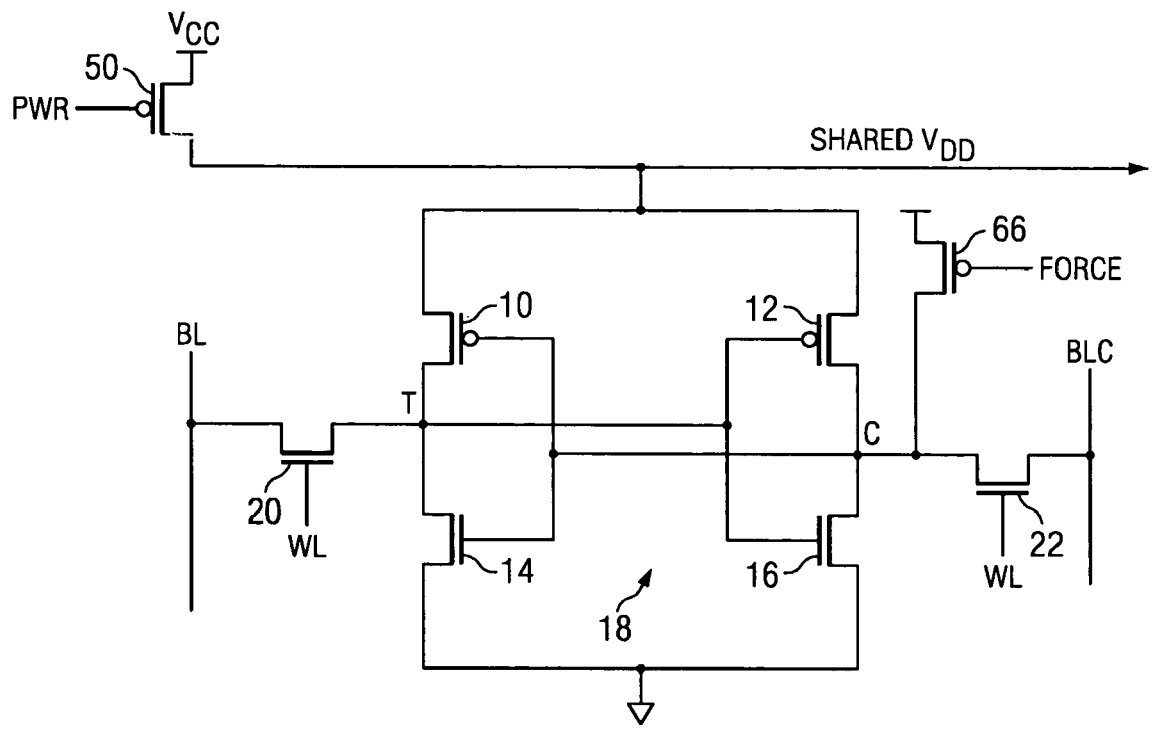
Figure 5D:
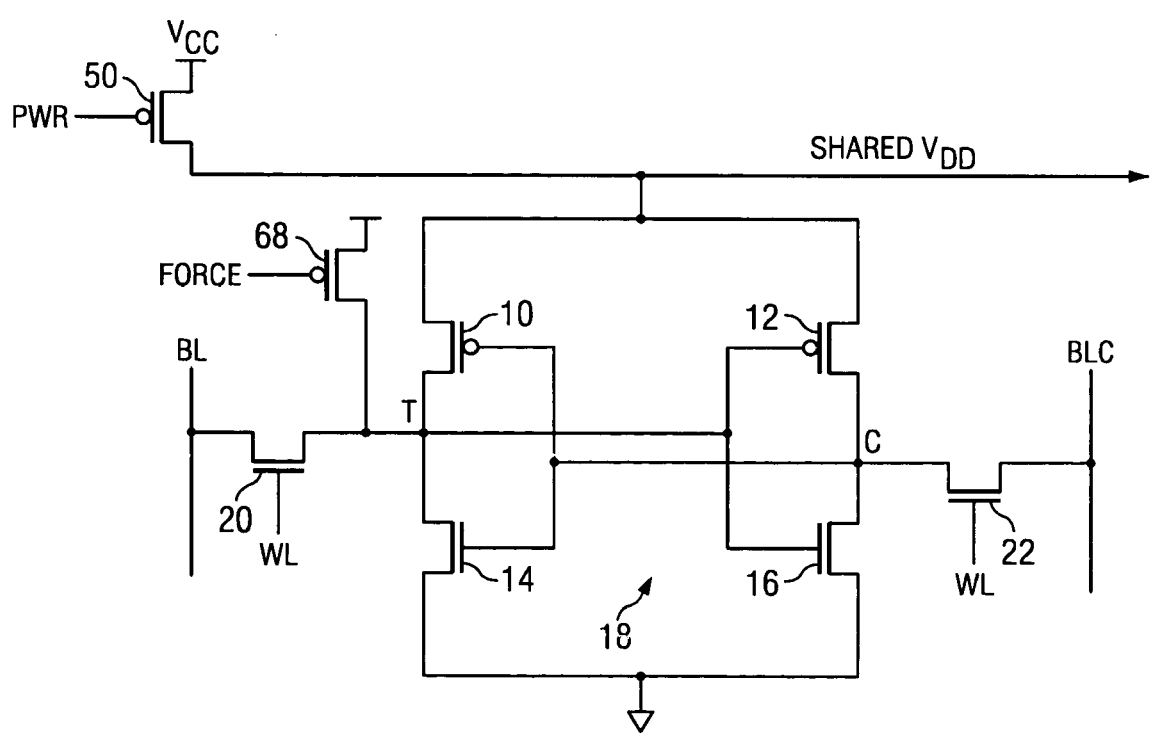

Alternative embodiments are shown in FIGS. 5b–5d. In FIG. 5b, it will be recognized that the n-channel transistor 62 could alternatively be connected (see transistor 64) between the true (T) node of the latch and ground. In FIGS. 5c–5d, it will be recognized that in either the T or C implementation, the transistor could instead comprise a p-channel transistor (reference 66 in FIG. 5c or reference 68 in FIG. 5d) connected to the shared Vdd bus or to Vcc with an active low FORCE signal.

Still further, in another embodiment, applicable to any of the T or C implementations, the p-channel transistor 50 connected between Vcc and the shared Vdd bus could instead comprise a NOT gate 60 as described above in FIG. 4.

Figure 6A:
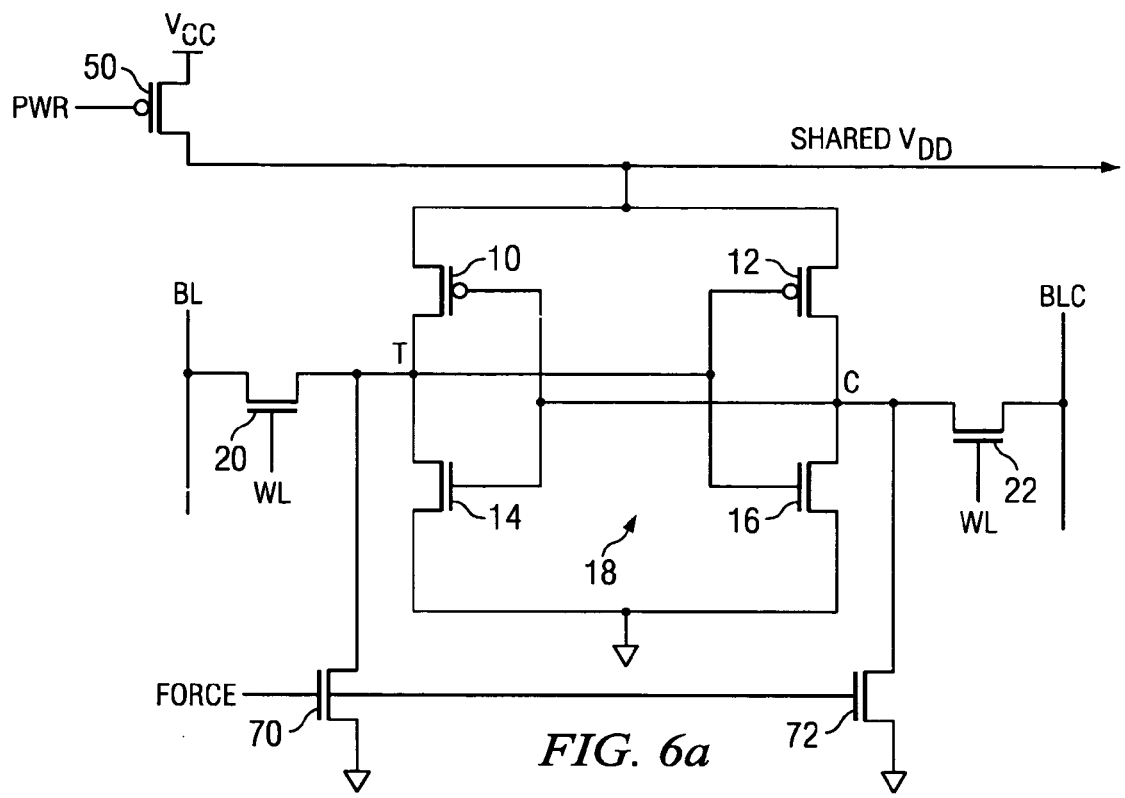
FIGS. 6a–6b are schematic diagram of a fourth embodiment for a volatile memory cell with a tamper detection data destroy response.
Figure 6B:
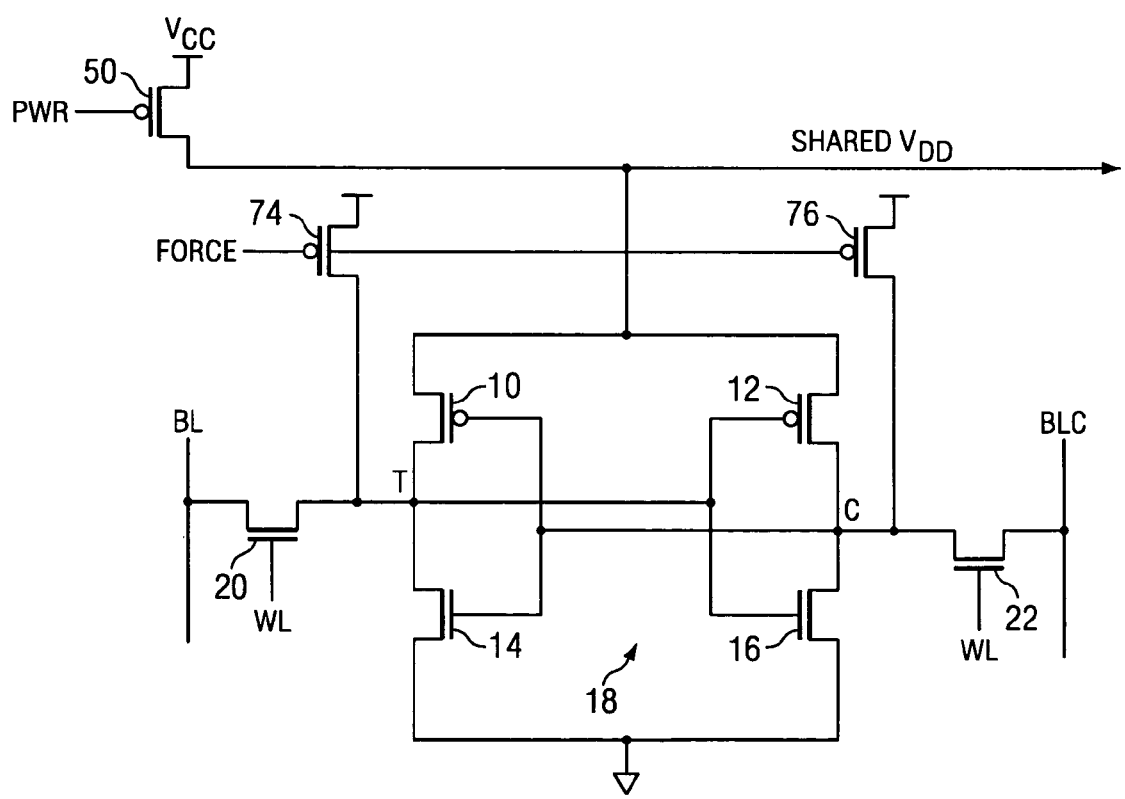

Reference is now made to FIGS. 6a–6b which illustrate a fourth embodiment for a volatile memory cell with a tamper detection data destroy response. In FIG. 6a, two additional n-channel transistors 70 and 72 are added to the conventional 6T memory cell. The first n-channel transistor 70 has its conduction terminals (drain/source) connected between the true (T) node of the 6T memory cell and ground. The second n-channel transistor 70 has its conduction terminals (drain/source) connected between the complement (C) node of the 6T memory cell and ground. The gates of the first and second n-channel transistors 70 and 72 are connected to receive a signal FORCE which is an active high control signal generated by the logic 40 in response to a detected tamper situation. When Power (PWR) goes high (thus isolating the shared Vdd bus for the memory cells from Vcc) and FORCE goes high, the two n-channel transistors 70 and 72 turn on and force the T and C nodes of the latch low. It will be recognized that this destroys the logic data state being held by the latch, but does not drive the latch to a known fixed data state. The destruction of the stored data is accomplished through dynamic gate charging.

In an alternative embodiment (shown in FIG. 6b), it will be recognized that the added two transistors could alternatively be p-channel transistors (74 and 76) connected to either the shared Vdd bus or to Vcc with an active low FORCE signal.

Again, the p-channel transistor 50 connected between Vcc and the shared Vdd bus could instead comprise a NOT gate 60 as described above.

Figure 7A:
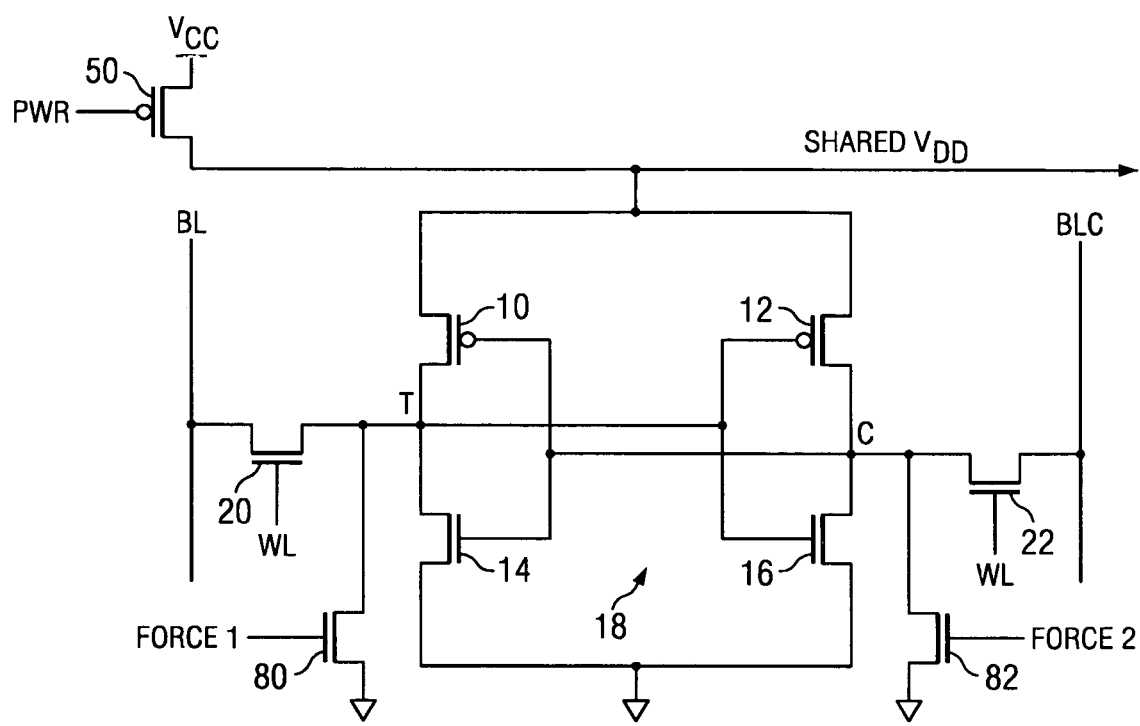
FIGS. 7a–7c are schematic diagrams of a fifth embodiment for a volatile memory cell with a tamper detection data destroy response.
Figure 7B:
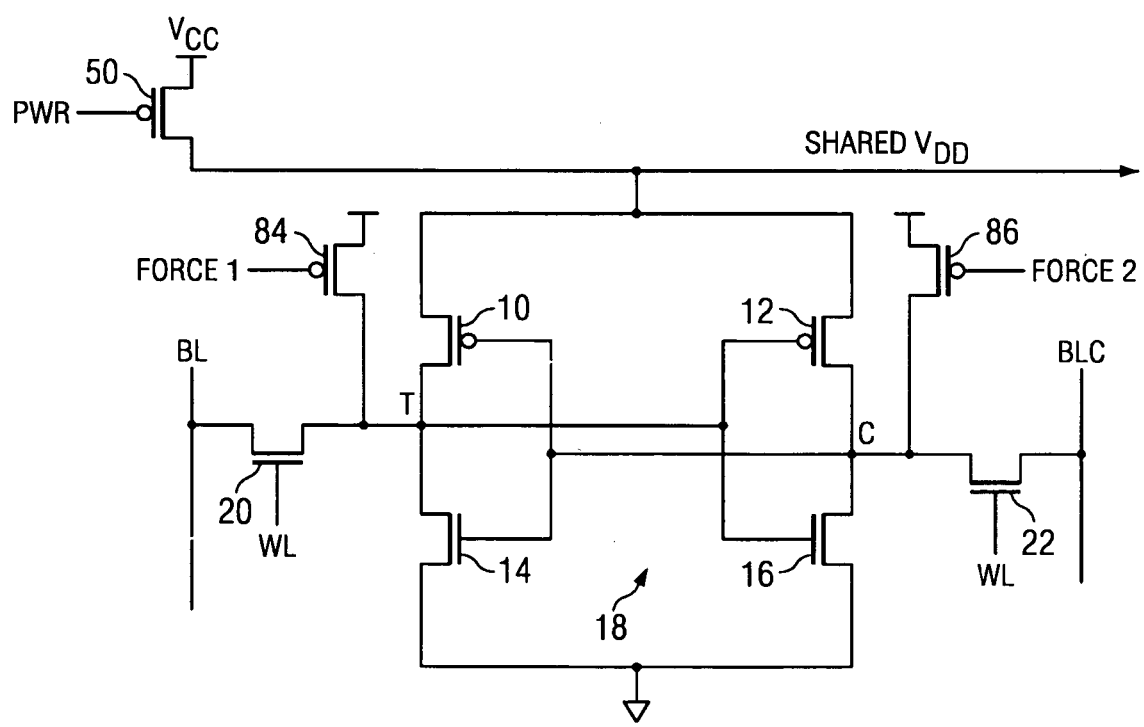
Figure 7C:
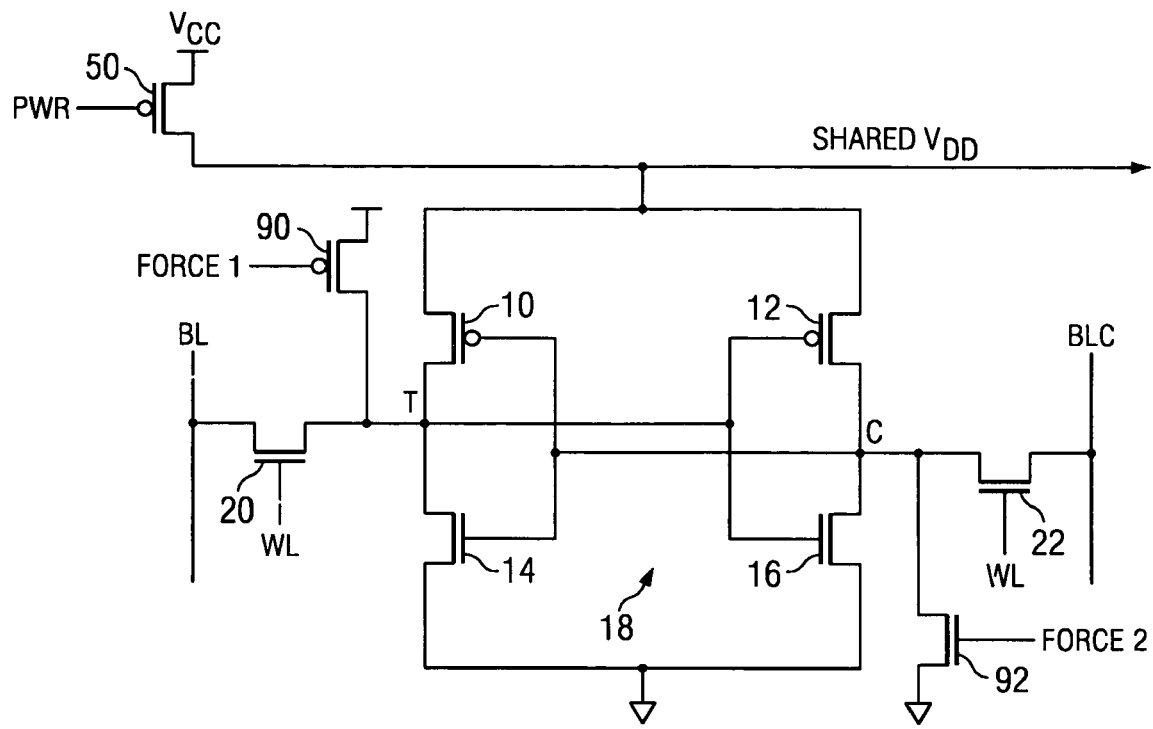

Reference is now made to FIGS. 7a–7c which illustrate a fifth embodiment for a volatile memory cell with a tamper detection data destroy response. In FIG. 7a, two additional n-channel transistors 80 and 82 are added to the conventional 6T memory cell. The first n-channel transistor 80 has its conduction terminals (drain/source) connected between the true (T) node of the 6T memory cell and Vcc. The gate of the first n-channel transistor is connected to receive a signal FORCE1 which is an active high control signal generated by the logic 40 in response to a detected tamper situation. The second n-channel transistor 82 has its conduction terminals (drain/source) connected between the complement (C) node of the 6T memory cell and ground. The gate of the second n-channel transistor 82 is connected to receive a signal FORCE2 which is an active high control signal generated by the logic 40 in response to a detected tamper situation. When Power (PWR) goes high (thus isolating the shared Vdd bus for the memory cells from Vcc), a selected one of FORCE1 and FORCE2 goes high first. The corresponding transistor turns on and forces the connected node (T or C) to one logic state. The other of the FORCE signals is then sent high. The corresponding transistor turns on and forces the connected node (T or C) to the opposite logic state. For example, FORCE2 goes high first and drives the C node to ground (with transistor 82), with FORCE1 next going high to drive the T node to ground (with transistor (80). It will be recognized that this destroys the logic data state being held by the latch, and advantageously drives the latch to a known fixed data state.

Alternatively, as shown in FIG. 7*b*, it will be recognized that the added two transistors could be p-channel transistors 84 and 86, oppositely connected (to either Vcc or shared Vdd), with an active low FORCE signal.

Again, the transistor 50 could instead comprise a NOT gate 60.

Still further, in the alternative illustrated in FIG. 7*c*, one of the two transistors could be a p-channel device 90 while the other is an n-channel device 92 and are controlled by appropriate FORCE signals. Although illustrated with the p-channel transistor 90 connected to the true (T) node and the n-channel transistor 92 connected to the complement (C) node, the opposite connection could be made if desired.

Again, the transistor 50 could instead comprise a NOT gate 60.

Figure 8:
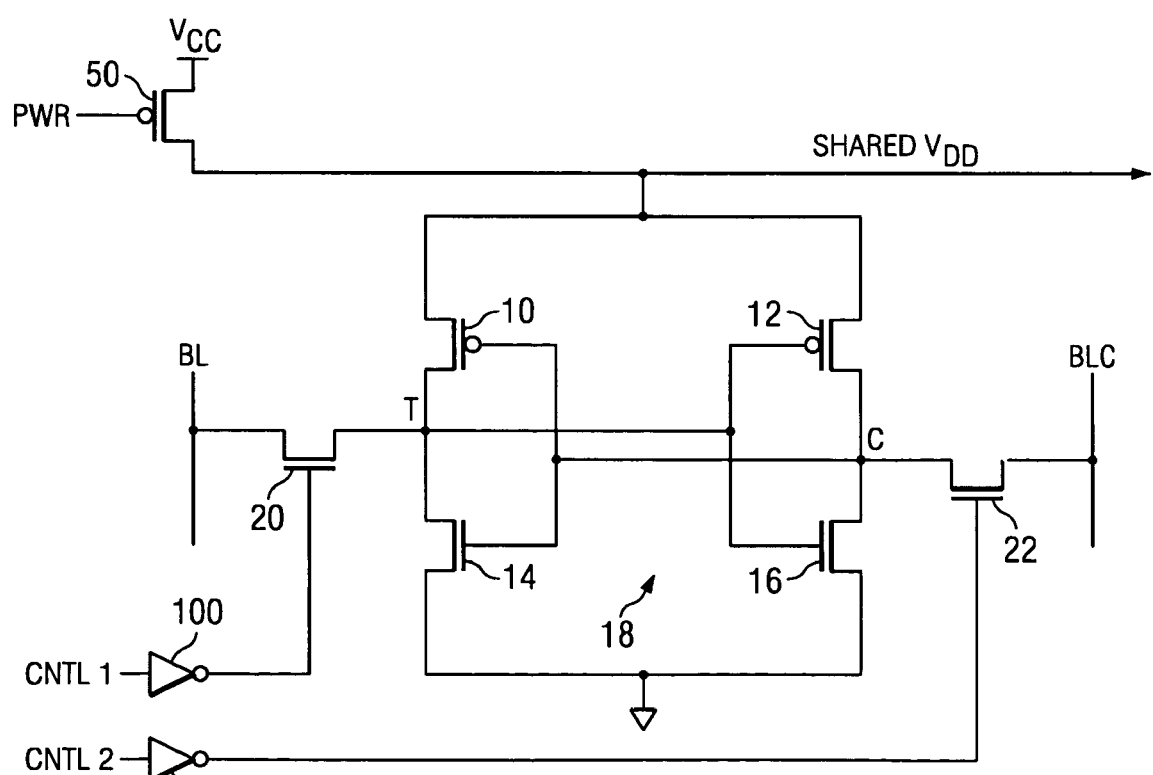
FIG. 8 is a schematic diagram of a sixth embodiment for a volatile memory cell with a tamper detection data destroy response.

Reference is now made to FIG. 8 which illustrates a sixth embodiment for a volatile memory cell with a tamper detection data destroy response. A pair of NOT logic gates 100 and 102 are added to the conventional 6T memory cell. A first NOT gate 100 is connected to the gate of the word line access/pass transistor 20 for the bit line (BL). A second NOT logic gate 102 is connected to the gate of the word line access/pass transistor 22 for the bit line complement (BLC). After PWR goes high (thus isolating the shared Vdd bus for the memory cells from Vcc), the tamper detect control circuitry drives one of the two lines (WL) high (with a low CNTL signal). This will cause the latch to become unbalanced. The PWR signal is then driven low to reconnect the shared Vdd bus to Vcc. As the latch powers up, the side of the latch with the pass gate on will go high and set the value stored in the latch. It will be recognized that this destroys the logic data state being held by the latch, and advantageously drives the latch to a known fixed data state.

Again, the p-channel transistor 50 connected between Vcc and the shared Vdd bus could instead comprise a NOT gate 60 as described above.

Figure 9:
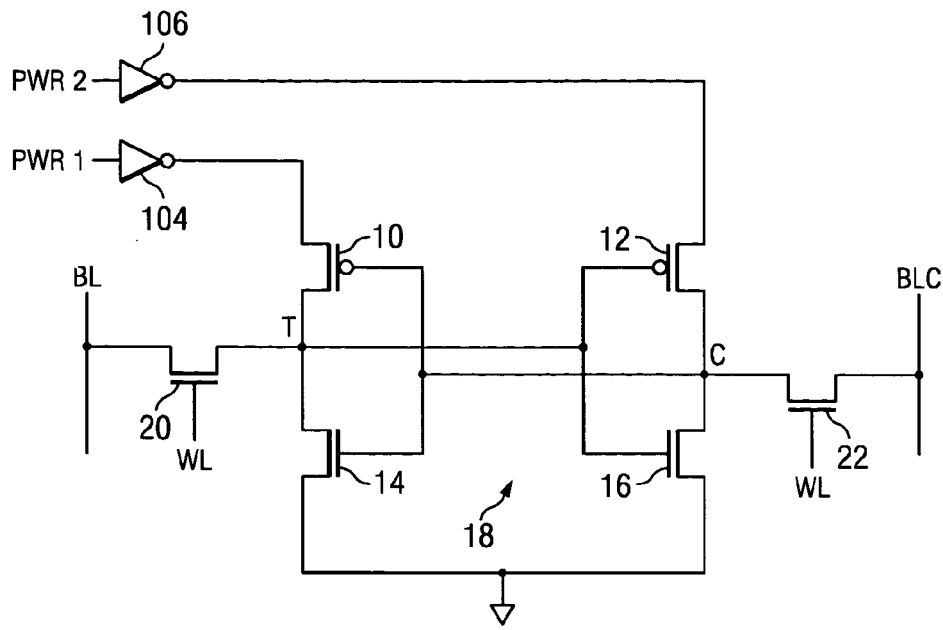
FIG. 9 is a schematic diagram of a seventh embodiment for a volatile memory cell with a tamper detection data destroy response.

Reference is now made to FIG. 9 which illustrates a seventh embodiment for a volatile memory cell with a tamper detection data destroy response. A pair of NOT logic gates 104 and 106 are added to the conventional 6T memory cell. A first NOT gate 104, receiving power signal PWR1, is connected to the source terminal of the p-channel transistor 10 in a first half of the latch 18 (for example, on the bit line (BL) side). A second NOT logic gate 106, receiving power signal PWR2, is connected to the source terminal of the p-channel transistor 12 in a second half of the latch 18 (for example, on the bit line complement (BLC) side). PWR1 and PWR2 drive the source terminals in the latch 18 low (for example, responsive to received active high signals). This circuit provides unique/individual Vcc/ground control over each side of the latch. In operation, the tamper detect control circuitry logic 40 first drives PWR1 and PWR2 high to take the memory cell off Vcc by driving the connected sources of the latch 18 to ground. Next, PWR1 is driven low causing its connected source to go high. By pulling up one half of the latch 18, this forces the latch to a preferred state. This state is then reinforced (or locked) by next driving PWR2 low. This will effectuate destruction of the previously held data value and a setting of the latch 18 into a known data state.

In an alternative embodiment, either of the NOT gates 104 or 106, but preferably the NOT gate 106 associated with PWR2, can be configured as a p-channel device 50.

Figure 10:
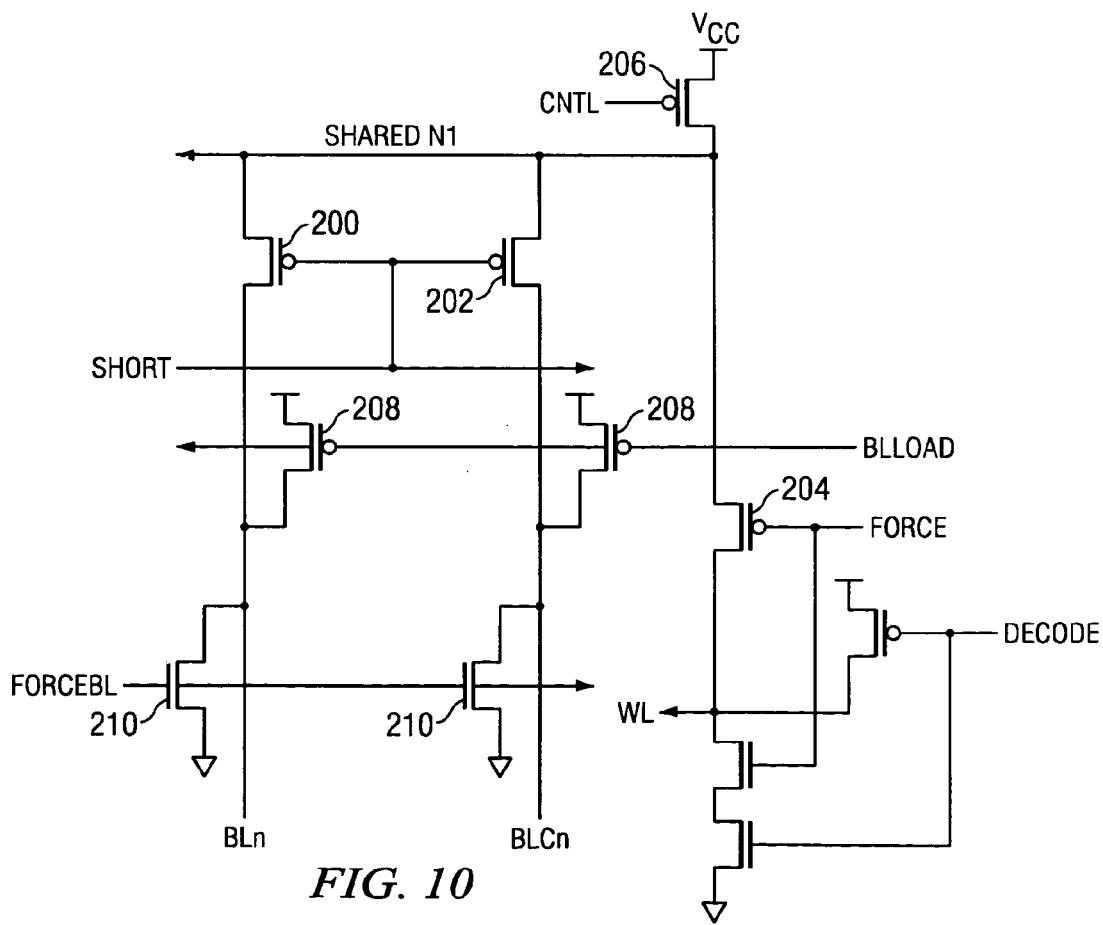
FIG. 10 is a schematic diagram of a circuit for reducing current draw from a battery by sharing charge between the bit lines and word lines of a memory.

Reference is now made to FIG. 10. Reducing current draw in these battery operated circuits a critical consideration. The circuit of FIG. 10 provides a means for reducing current draw from the battery by sharing charge between the bit lines and word lines of the memory. Each pair of bit lines in the memory (BLn/BLCn) includes a pair of pass transistors 200 and 202 having a shared gate connection to receive a SHORT signal. These pass transistors 200 and 202 are preferably p-channel devices. When SHORT goes low, the p-channel pass transistors 200 and 202 turn on and connect all the bit lines to a common shared node (N1). The shared node N1 is connected to a word line WL through another p-channel device 204 (this circuit is preferably replicated for each word line). That p-channel device 204 receives a control signal FORCE at its gate. When FORCE goes low, the shared node N1 is connected to the word line WL and charge is shared between the bit lines and the word lines. This shared charge is not sufficient to raise the word lines to Vdd/Vcc. This is accomplished through the action of a third p-channel device 206 connected between the shared node N1 and Vdd/Vcc. This third p-channel device 206 receives a control (CNTL) signal at its gate. SHORT is driven high to disconnect the bit lines from the shared node N1, and then CNTL is driven low to connect the shared node N1 to Vdd/Vcc. Responsive thereto, the shared node N1, along with the word lines, are driven the rest of the way up to Vdd/Vcc. Advantageously, due to the precharging of the word lines using the shared charge from the bit lines, the operation to finish driving the word lines to Vdd/Vcc requires much less current (perhaps as much as one half the normal amount of current needed for that task). FORCE can then be driven high to disconnect the word lines from the shared node N1.

Each bit line (BL and BLC) further includes an additional pair of transistors 208 and 210 connected to a bit line load (BLLOAD) and bit line force (FORCEBL) signal, respectively. The first of these transistors 208 is a p-channel device connecting the bit line to Vcc/Vdd. The BLLOAD signal is connected to the gate of each p-channel device 208. The second of these transistors 210 is an n-channel device connecting the bit line to ground. The FORCEBL signal is connected to the gate of each n-channel device 210. Once each of the word lines has been activated using charge sharing followed by Vcc/Vdd pull up, BLLOAD is driven high by the tamper detection circuit and FORCEBL is driven high. This disconnects the bit lines from Vcc and drives both BL and BLC in each memory cell to ground to effectuate a destruction of the data stored in the latch.

As an alternative embodiment, the p-channel and n-channel transistors (208 and 210) could instead be connected to only one of the bit lines in each cell (BL or BLC). The turning off of the p-channel 208 and on of the n-channel 210 would in that implementation force the corresponding bit line of the cell to ground which would destroy the stored data and force the latch into a known data state.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory circuit, comprising:
a data latch having a true latch node and a complement latch node; and
circuitry responsive to a control signal to short the true latch node to the complement latch node for the purpose of destroying data stored by the latch.

2. The circuit of claim 1 wherein the circuitry comprises a p-channel transistor having its conduction terminals connected between the true latch node and the complement latch node and its gate connected to receive the control signal.

3. The circuit of claim 1 wherein the circuitry comprises an n-channel transistor having its conduction terminals connected between the true latch node and the complement latch node and its gate connected to receive the control signal.

4. The circuit of claim 1 wherein the memory circuit further includes:
a first pass gate coupling the true latch node to a bit line;
a second pass gate coupling the complement latch node to a complement bit line.

5. The circuit of claim 4 wherein the data latch is coupled to a reference voltage line, further comprising a circuit which disconnects the reference voltage line from the latch when the control signal is activated.

6. A memory circuit, comprising:
a data latch having a true latch node and a complement latch node;
a first pass gate coupling the true latch node to a bit line;
a second pass gate coupling the complement latch node to a complement bit line; and
a logic circuit generating a logic control signal to simultaneously activate the first and second pass gates to short the true and complement latch nodes to the bit line and complement bit line, respectively, for the purpose of destroying data stored by the latch.

7. The circuit of claim 6 wherein the data latch is coupled to a reference voltage line, further comprising a circuit which grounds the reference voltage line when the logic circuit generates the logic control signal.

8. A memory circuit, comprising:
a data latch having a true latch node and a complement latch node;
circuitry responsive to a control signal to short one of the true/complement latch nodes of the latch to a reference voltage for the purpose of destroying data stored by the latch.

9. The circuit of claim 8 wherein the circuitry comprises an n-channel transistor having its conduction tenninals connected between the one of the true/complement latch nodes and the reference voltage.

10. The circuit of claim 8 wherein the circuitry comprises a p-channel transistor having its conduction terminals connected between the one of the true/complement latch nodes and the reference voltage.

11. The circuit of claim 8 wherein the data latch is coupled to a reference voltage line, further comprising a circuit which disconnects the reference voltage line from the latch when the control signal is activated.

12. The circuit of claim 8 wherein the memory circuit further includes:
a first pass gate coupling the true latch node to a bit line;
a second pass gate coupling the complement latch node to a complement bit line.

13. A memory circuit, comprising:
a data latch having a true latch node and a complement latch node; and
circuitry responsive to at least one control signal to short both the true and complement latch nodes of the latch to at least one reference voltage for the purpose of destroying data stored by the latch.

14. The circuit of claim 13 wherein the circuitry comprises:
a first n-channel transistor having its conduction terminals connected between the true latch node and the reference voltage; and
a second n-channel transistor having its conduction terminals connected between the complement latch node and the reference voltage.

15. The circuit of claim 14 wherein the a gate of the first transistor and a gate of the second transistor receive the same control signal.

16. The circuit of claim 14 wherein the a gate of the first transistor and a gate of the second transistor receive the different control signals.

17. The circuit of claim 13 wherein the circuitry comprises:
a first p-channel transistor having its conduction terminals connected between the true latch node and the reference voltage; and
a second p-channel transistor having its conduction terminals connected between the complement latch node and the reference voltage.

18. The circuit of claim 17 wherein a gate of the first transistor and a gate of the second transistor receive the same control signal.

19. The circuit of claim 17 wherein a gate of the first transistor and a gate of the second transistor receive the different control signals.

20. The circuit of claim 13 wherein the circuitry comprises:
an n-channel transistor having its conduction terminals connected between one of the true/complement latch nodes and a first reference voltage; and
a p-channel transistor having its conduction terminals connected between the other of the true/complement latch nodes and a second reference voltage.

21. The circuit of claim 13 wherein the data latch is coupled to a reference voltage line, further comprising a circuit which disconnects the reference voltage line from the latch when the control signal is activated.

22. The circuit of claim 13 wherein the memory circuit further includes:
a first pass gate coupling the true latch node to a bit line;
a second pass gate coupling the complement latch node to a complement bit line.

23. A memory circuit, comprising:
a memory cell including a data node;
a pass gate coupling the data node of the memory cell to a bit line; and
circuitry responsive to at least one control signal to short the bit line to a reference voltage while the pass gate is activated for the purpose of destroying data stored by the memory cell.

24. The circuit of claim 23 wherein the circuitry comprises a transistor having conduction terminals connecting the bit line to a reference voltage and a gate coupled to receive the at least one control signal.

25. The circuit of claim 23 wherein the circuitry comprises a first transistor having its conduction terminals connecting the bit line to a first reference voltage and a second transistor having its conduction terminals connecting the bit line to a second reference voltage, the first and second transistors each having a gate coupled to receive the at least one control signal.

26. The circuit of claim 23 further including a coupling circuit for selectively shorting the bit line to a word line to share charge therebetween.

27. The circuit of claim 26 further including a pull up device to pull the word line up to a positive reference voltage after charge has been shared between the bit line and word line.

* * * * *